US006825077B2

(12) United States Patent
Tran

(10) Patent No.: US 6,825,077 B2
(45) Date of Patent: Nov. 30, 2004

(54) METHOD OF FORMING MEMORY CELLS AND A METHOD OF ISOLATING A SINGLE ROW OF MEMORY CELLS

(75) Inventor: Luan C. Tran, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/713,647

(22) Filed: Nov. 13, 2003

(65) Prior Publication Data

US 2004/0102003 A1 May 27, 2004

Related U.S. Application Data

(62) Division of application No. 10/280,757, filed on Oct. 24, 2002, which is a division of application No. 09/810,933, filed on Mar. 16, 2001, now Pat. No. 6,545,904.

(51) Int. Cl.$^7$ .......................................... H01L 21/8242
(52) U.S. Cl. ..................... 438/241; 438/239; 438/257; 438/258
(58) Field of Search ................................ 438/257, 258, 438/239, 241; 257/296, 314

(56) References Cited

U.S. PATENT DOCUMENTS

| 4,417,325 A | * 11/1983 | Harari ................... 365/185.08 |
| 5,254,489 A | 10/1993 | Nakata |
| 5,464,792 A | 11/1995 | Tseng et al. |
| 5,553,028 A | * 9/1996 | McLaury .................... 365/205 |
| 5,596,218 A | 1/1997 | Soleimani et al. |
| 5,620,908 A | 4/1997 | Inoh et al. |
| 5,638,318 A | 6/1997 | Seyyedy |
| 5,674,788 A | 10/1997 | Wristers et al. |
| 5,677,865 A | 10/1997 | Seyyedy |
| 5,680,344 A | 10/1997 | Seyyedy |
| 5,693,971 A | * 12/1997 | Gonzalez ................... 257/314 |
| 5,700,733 A | 12/1997 | Manning |
| 5,716,864 A | 2/1998 | Abe |
| 5,828,615 A | 10/1998 | Mukunoki et al. |
| 5,880,989 A | 3/1999 | Wilson et al. |
| 5,880,991 A | 3/1999 | Hsu et al. |

(List continued on next page.)

FOREIGN PATENT DOCUMENTS

WO    WO96/39713    12/1996

OTHER PUBLICATIONS

C.T. Liu et al., *Multiple Gate Oxide Thickness for 2GHz System–on–A–Chip Techniques*, 1998 IEEE, pp. 21.2.1–21.2.4 (4 pages).

(List continued on next page.)

Primary Examiner—Maria Guerrero
(74) Attorney, Agent, or Firm—Wells St. John P.S.

(57) ABSTRACT

The present invention includes a $6F^2$ DRAM array formed on a semiconductor substrate. The memory array includes a first memory cell. The first memory cell includes a first access transistor and a first data storage capacitor. A first load electrode of the first access transistor is coupled to the first data storage capacitor via a first storage node formed on the substrate. The memory array also includes a second memory cell. The second memory cell includes a second access transistor and a second data storage capacitor. A first load electrode of the second access transistor is coupled to the second data storage capacitor via a second storage node formed on the substrate. The first and second access transistors have a gate dielectric having a first thickness. The memory array further includes an isolation gate formed between the first and second storage nodes and configured to provide electrical isolation therebetween. The isolation gate has a gate dielectric having a second thickness that is greater than the first thickness. The isolation gate dielectric may extend above or below a surface of the substrate.

10 Claims, 5 Drawing Sheets

U.S. PATENT DOCUMENTS

| | | | |
|---|---|---|---|
| 5,901,078 A * | 5/1999 | Porter et al. ................ | 365/149 |
| 5,960,302 A | 9/1999 | Ma et al. | |
| 5,972,783 A | 10/1999 | Arai et al. | |
| 5,994,749 A | 11/1999 | Oda | |
| 6,077,742 A | 6/2000 | Chen et al. ................ | 438/255 |
| 6,141,204 A | 10/2000 | Schuegraf et al. | |
| 6,150,211 A | 11/2000 | Zahurak | |
| 6,153,899 A | 11/2000 | Ping | |
| 6,165,833 A | 12/2000 | Parekh et al. | |
| 6,175,146 B1 | 1/2001 | Lane et al. | |
| 6,294,436 B1 | 9/2001 | Park et al. ................ | 438/396 |
| 6,458,655 B1 * | 10/2002 | Yuzuriha et al. ............ | 438/257 |
| 6,590,817 B2 | 7/2003 | Siek ......................... | 365/201 |

OTHER PUBLICATIONS

Lian–Hoon Ko et al., *The Effect of Nitrogen Incorporation into the Gate Oxide by Using Shallow Implantation of Nitrogen and Drive–in Process*, 1998 IEEE, pp. 32–35 (4 pages).

Brian Doyle et al., *Simultaneous Growth of Different Thickness Gate Oxides is Silicon CMOS Processing*, 1995 IEEE, pp. 301–302 (2 pages).

T. Kuroi et al., *The Effects of Nitrogen Implantation Into P+ Poly–Silicon Gate on Gate Oxide Properties*, 1994 IEEE, pp. 107–108 (2 pages).

* cited by examiner

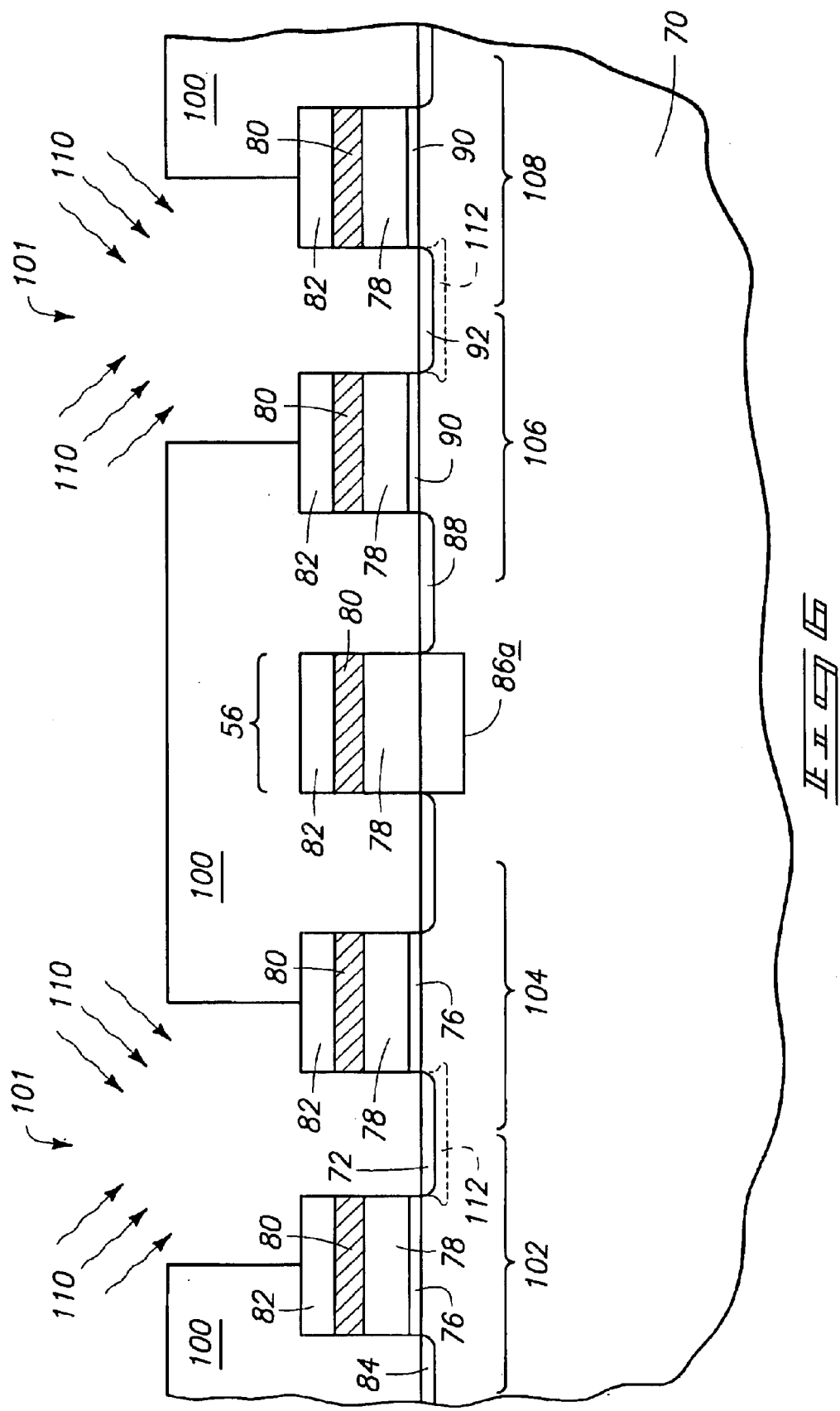

METHOD OF FORMING MEMORY CELLS AND A METHOD OF ISOLATING A SINGLE ROW OF MEMORY CELLS

This patent application is a Division of U.S. patent application Ser. No. 10/280,757, filed Oct. 24, 2002, entitled "A $6F^2$ DRAM Array, A DRAM Array Formed On A Semiconductive Substrate, A Method Of Forming Memory Cells In A $6F^2$ DRAM Array And A Method Of Isolating A Single Row Of Memory Cells In A $6F^2$ DRAM Array", naming Luan Tran as inventor, which in turn was a Division of U.S. patent application Ser. No. 09/810,933, filed Mar. 16, 2001, now U.S. Pat. No. 6,545,904, the disclosures of which are incorporated herein by reference.

TECHNICAL FIELD

This invention relates generally to a $6F^2$ DRAM array, a DRAM array formed on a semiconductive substrate, a method of forming memory cells in a $6F^2$ DRAM array and a method of isolating a single row of memory cells in a $6F^2$ DRAM array.

BACKGROUND OF THE INVENTION

The reduction in memory cell and other circuit size required for high density dynamic random access memories (DRAMs) and other circuitry is a continuing goal in semiconductor fabrication. Implementing electric circuits involves connecting isolated devices through specific electric paths. When fabricating silicon and other material into integrated circuits, it is necessary to isolate devices built into the substrate from one another. Electrical isolation of devices as circuit density increases is a continuing challenge.

One method of isolating devices involves the formation of a semi-recessed or fully recessed oxide in the non-active (or field) area of the substrate. These regions are typically termed as "field oxide" and are formed by LOCal Oxidation of exposed Silicon, commonly known as LOCOS. One approach in forming such oxide is to cover the active regions with a layer of silicon nitride that prevents oxidation from occurring therebeneath. A thin intervening layer of a sacrificial pad oxide is provided intermediate the silicon substrate and nitride layer to alleviate stress and protect the substrate from damage during subsequent removal of the nitride layer. The unmasked or exposed field regions of the substrate are then subjected to a wet ($H_2O$) oxidation, typically at atmospheric pressure and at temperatures of around 1000° C., for two to four hours. This results in field oxide growth where there is no masking nitride.

However, LOCOS structures do not necessarily lend themselves to progressively smaller feature sizes and/or increased densities. This is discussed to some extent in U.S. Pat. No. 5,700,733, filed on Jun. 27, 1995, entitled "Semiconductor Processing Methods Of Forming Field Oxide Regions On A Semiconductor Substrate" and issued to M. Manning, the disclosure of which is incorporated herein by reference for its teachings and which is assigned to the assignee of this patent document.

The above-noted patent presents a technique for using shallow trench isolation (STI) to realize a compact and robust DRAM cell having an area of $8F^2$. However, increasing demand for yet more compact and robust memory designs has continued to drive demand for even smaller cell areas.

Another alternative isolation technique uses an isolation gate structure formed between adjacent memory cells. The gate structure is biased to greatly reduce the number of mobile charge carriers in the semiconducting material beneath the isolation gate structure. This architecture has the advantage of providing extremely compact memory cells having an effective area of about $6F^2$ (compared, for example, to an area of about $8F^2$ for the LOCOS structures described above), resulting in a compact memory device. However, conventional isolation gate structures provide leakage charge which flows, at least in part, into the storage nodes of the memory device. The leakage charge, in turn, is a limiting factor in storage times between refresh cycles.

Additionally, for many gate-isolated DRAM structures, it may be necessary to use double row redundancy for replacement of rows of memory cells that include defects. This arises because a row that has been replaced, and thus includes storage nodes that are not being periodically refreshed or otherwise actively biased, includes memory cells that float to various voltages. In turn, this can cause a memory cell in a row that is separated from the row that has been replaced by only one isolation gate to behave inappropriately. As a result, at least some DRAMs employing isolation gates between some rows of memory cells also use an arrangement whereby both the row of memory cells that includes one or more defects, and the neighboring row that is isolated from that row by the isolation gate, are replaced with a pair of redundant rows of memory cells. In turn, this causes the DRAM integrated circuit to be larger than might be the case if other replacement arrangements for rows of memory cells that are defective were practicable.

Needed are apparatus and methods for reducing isolation leakage and access device leakage for improved, compact memory cells and memory cell arrays.

SUMMARY

In a first aspect, the present invention includes a $6F^2$ DRAM array. The memory array includes a first memory cell. The first memory cell includes a first access transistor and a first data storage capacitor. A first load electrode of the first access transistor is coupled to the first data storage capacitor via a first storage node formed on the substrate. The memory array also includes a second memory cell. The second memory cell includes a second access transistor and a second data storage capacitor. A first load electrode of the second access transistor is coupled to the second data storage capacitor via a second storage node formed on the substrate. The first and second access transistors each include a gate dielectric having a first thickness. The memory array further includes an isolation gate formed between the first and second storage nodes and configured to provide electrical isolation therebetween. The isolation gate includes a gate dielectric having a second thickness that is greater than the first thickness used in at least the first and second access transistors.

In another aspect, the present invention includes a method of isolating a single row of memory cells in a $6F^2$ DRAM array. The method includes providing pairs of rows of memory cells. Each row includes a plurality of access devices each having a gate dielectric with a first thickness. The method also includes providing an isolation gate separating rows comprising each pair of rows. Each isolation gate has a gate dielectric with a second thickness. The second thickness is greater than the first thickness. The isolation gates are configured to isolate one of the pair of rows from another of the pair of rows in response to application of a suitable voltage.

BRIEF DESCRIPTION OF THE DRAWINGS

FIG. 6 is a simplified cross-sectional view including some of the structures of FIG. 3 at an earlier stage in processing, in accordance with an embodiment of the present invention.

DETAILED DESCRIPTION

This disclosure of embodiments in accordance with the present invention is submitted in furtherance of the constitutional purposes of the U.S. Patent Laws "to promote the progress of science and useful arts" (Article 1, Section 8).

Figure 1:
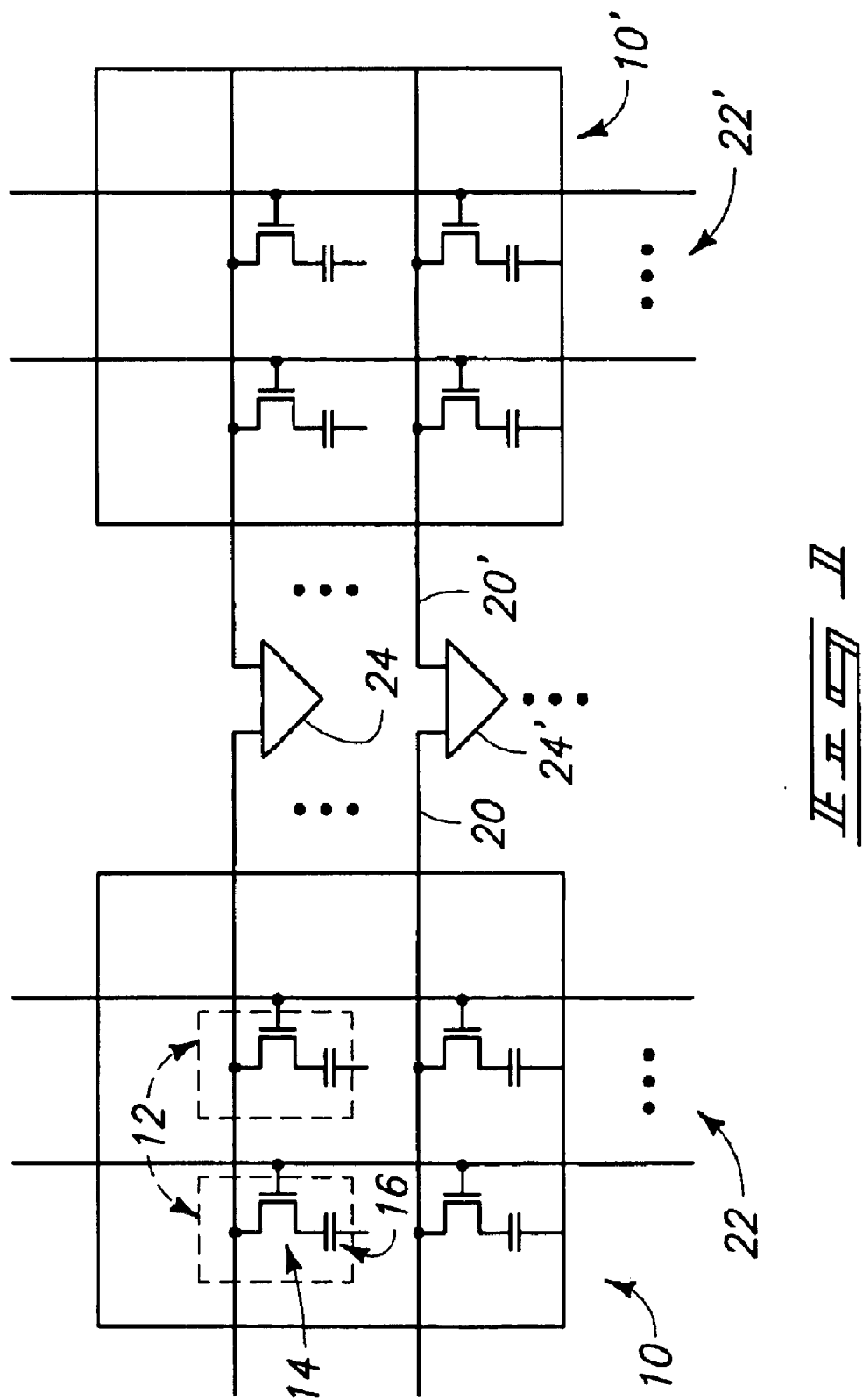
FIG. 1 is a simplified schematic diagram describing an exemplary pair of memory arrays in an open bitline configuration and employing memory cells formed from one transistor and one capacitor, in accordance with the prior art.

FIG. 1 is a simplified schematic diagram describing a pair of memory arrays 10, 10' in an open bitline configuration, each employing memory cells 12 formed from one transistor 14 and one capacitor 16, in accordance with the prior art. It will be appreciated that other types of access devices 14 having a control electrode and one or more load electrodes may be employed.

The memory arrays 10, 10' are each coupled to respective groups of bitlines 20, 20' and respective groups of wordlines 22, 22'. The two groups of bitlines 20, 20' are coupled, one from each of the memory arrays 10, 10', to sense amplifiers 24, 24'. The sense amplifiers 24, 24' comprise peripheral circuitry, i.e., circuitry employed in support of the memory arrays 10, 10' and generally formed outside of peripheries of the memory arrays 10, 10'.

In operation, one memory cell 12 is selected, for example, when two wordlines 22, 22' and one bitline 20 are activated. The wordlines 22 and 22' are each coupled to a respective gate electrode of a respective one of the transistors 14 and the bitline 20 is coupled to a load electrode of one of these transistors 14. That transistor 14 is then turned ON, coupling charge stored in the capacitor 16 to the associated bitline 20. The sense amplifier 24 or 24' then senses the charge coupled from the capacitor 16 to the bitline 20, compares that signal to a reference signal such as a reference charge $Q_{REF}$ or reference voltage coupled to a corresponding bitline 20', amplifies the resulting signal and latches the amplified signal for an appropriate duration. This allows data represented by the charge stored in the capacitor 16 to be accessed external to the memory arrays 10, 10' and also allows the capacitor 16 to store charge representative of the data from the memory cell 12 back into that memory cell 12.

Many types of memories use sense amplifiers 24, 24' that pre-charge the bitlines 20 to a predetermined reference voltage level, usually about one-half of a power supply voltage $V_{CC}$. However, in some types of memories, this is not possible for any of a number of technical reasons. In some of these types of memories, a reference charge $Q_{REF}$ is generated for comparison purposes as described above. Choosing an appropriate magnitude of the reference signal 16 allows optimal dynamic range and maximizes charge storage times consistent with the power supply voltage $V_{CC}$.

Sense amplifiers similar to the sense amplifiers 24, 24' of FIG. 1 are described, for example, in U.S. Pat. No. 5,680,344, entitled "Circuit And Method Of Operating A Ferroelectric Memory In A DRAM Mode", in U.S. Pat. No. 5,638,318, entitled "Ferroelectric Memory Using Ferroelectric Reference Cells", and in U.S. Pat. No. 5,677,865, entitled "Ferroelectric Memory Using Reference Charge Circuit", all issued to M. Seyyedy and assigned to the assignee of this invention, which patents are hereby incorporated herein for their teachings. Other suitable types of sense amplifiers may also be employed for the sense amplifiers 24, 24' of FIG. 1. It will be appreciated that elements formed in the sense amplifiers and other circuitry, within or outside of the memory arrays, may employ transistors having characteristics, designs and gate thicknesses that may differ from those employed in defining the memory cells 12.

Figure 2:
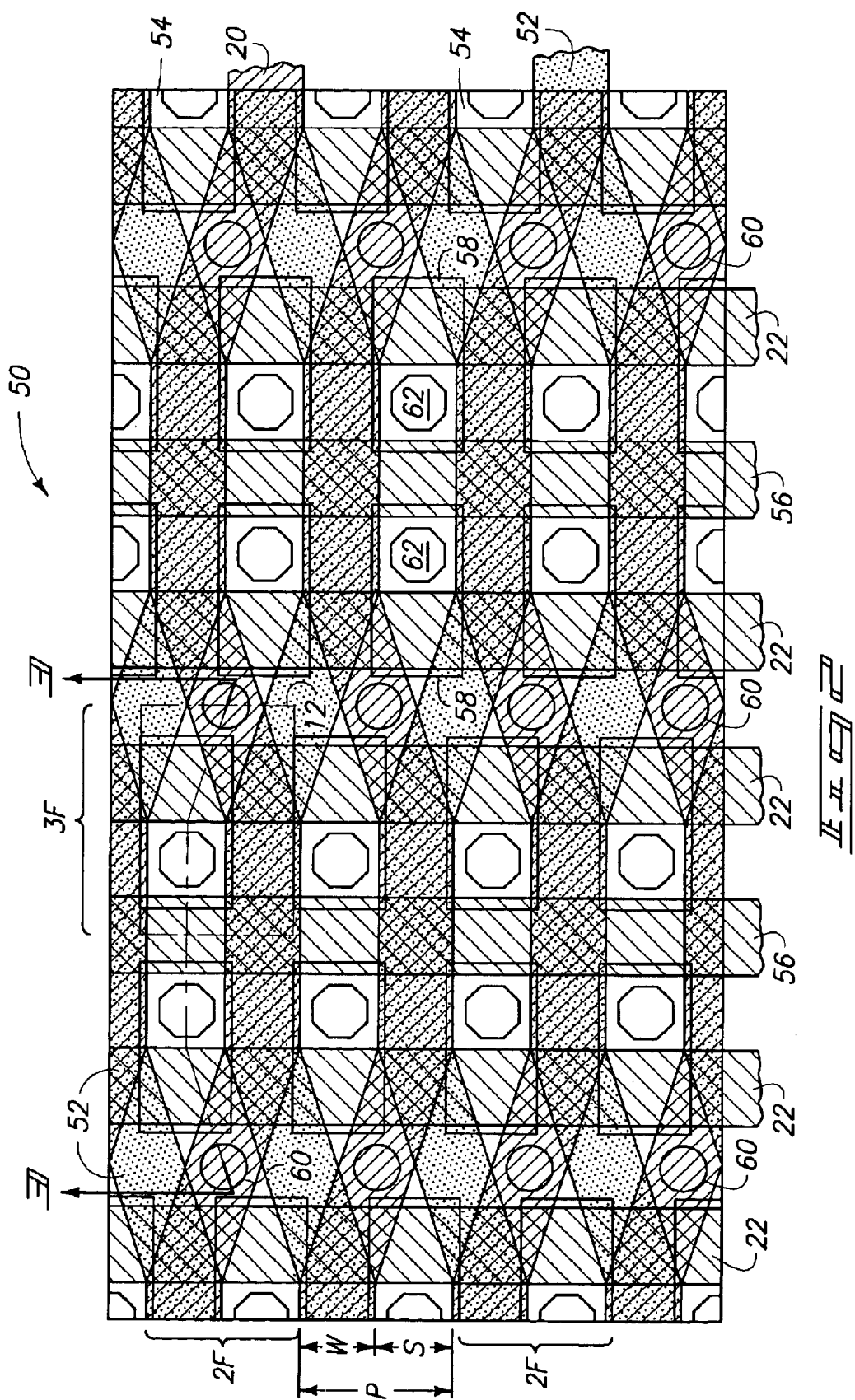
FIG. 2 is a simplified plan view of a circuit layout for a 6F² memory array, in accordance with an embodiment of the present invention.

FIG. 2 is a simplified plan view of a portion of a circuit layout for a 6F² memory array 50, in accordance with an embodiment of the present invention. The memory array 50 corresponds to the memory arrays 10, 10' of FIG. 1.

Shallow trench isolation (STI) areas 52 are represented as stippled areas following a serpentine path across the memory array 50, with active areas 54 intervening between adjacent STI areas 52. Active areas 54 are shown as areas that are void of the stippling denoting the STI areas 52.

Bitlines 20, shown as hatched areas, also follow a serpentine path across the memory array 50, but are typically formed much later in processing than the STI areas 52. Wordlines 22 (FIG. 1) extend along an axis intersecting the STI areas 52 and the bitlines 20, and extend across portions of the active areas 54 where the wordlines 22 form gates of access devices or transistors 14 (FIG. 1).

The memory array 50 also includes isolation gates 56 interspersed between selected ones of the wordlines 22. The memory array 50 further includes capacitor containers 58, represented as rectangles, and bitline contacts 60, represented as circles. Container capacitors formed within the capacitor containers 58 are coupled to the active areas via storage node contacts 62. In one embodiment, the storage node contacts 62 comprise conductive material extending to selected portions of the active area 54 and shown as octagons at one end of each of the capacitor containers 58. While the access devices 14 from FIG. 1 are not explicitly shown in FIG. 2 for clarity of illustration and ease of understanding, each access device 14 includes, e.g., a bitline contact 60, an adjacent wordline 22 and an adjacent storage node contact 62. The bitline contact 60 and storage node contact 62 correspond to load electrodes of the access device 14, while the wordline 22 corresponds to a control electrode.

A cell plate (not shown) formed of a conductive material such as doped polysilicon extends across tops of the capacitor containers 58 and forms a common electrode or signal ground for capacitors formed within the capacitor containers 58. The isolation gates 56 are configured to isolate adjacent ones of the storage node contacts 62.

Each memory cell 12 (FIG. 1) within the memory array 50 includes part of one of the bitline contacts 60 (these are shared by adjacent memory cells 12), a storage node contact 62, a portion of one active area 54, a portion of one isolation gate 56 and a portion of one STI area 52 and is bounded on one side by a corresponding portion of another STI area 52. Isolation between storage node contacts 62 formed in a common portion of an active area 54 that includes one of the bitline contacts 60 results because only one of the pair of wordlines 22 traversing the common portion of active area 54 is turned "ON" at any one time.

As a result, the architecture shown in FIG. 2 provides a compact memory cell having an area less than that of, for example, the previously-discussed LOCOS memory structure. This area is equal to about 3F×2F, or less, where "F" is defined as equal to one-half of minimum pitch, with minimum pitch (i.e., "P") being defined as equal to the smallest distance of a line width (i.e., "W") plus width of a space immediately adjacent said line on one side of said line between said line and a next adjacent line in a repeated pattern within the array (i.e., "S"). Thus, in the preferred implementation, the consumed area of a given memory cell 12 is no greater than about $6F^2$.

In all DRAMs, the charge stored in the capacitors 16 (FIG. 1) must be read out, amplified and then written back into the capacitors 16, which operations are collectively referred to as a "refresh" cycle. The isolation gates 56 contribute to leakage currents that, in turn, provide charge to the capacitors 16 (not illustrated in FIG. 2) formed in the capacitor containers 58. As a result, the memory array 50 must be refreshed more frequently than might otherwise be the case. This, in turn, increases power dissipation by the memory array 50 and reduces maximum data availability.

Figure 3:
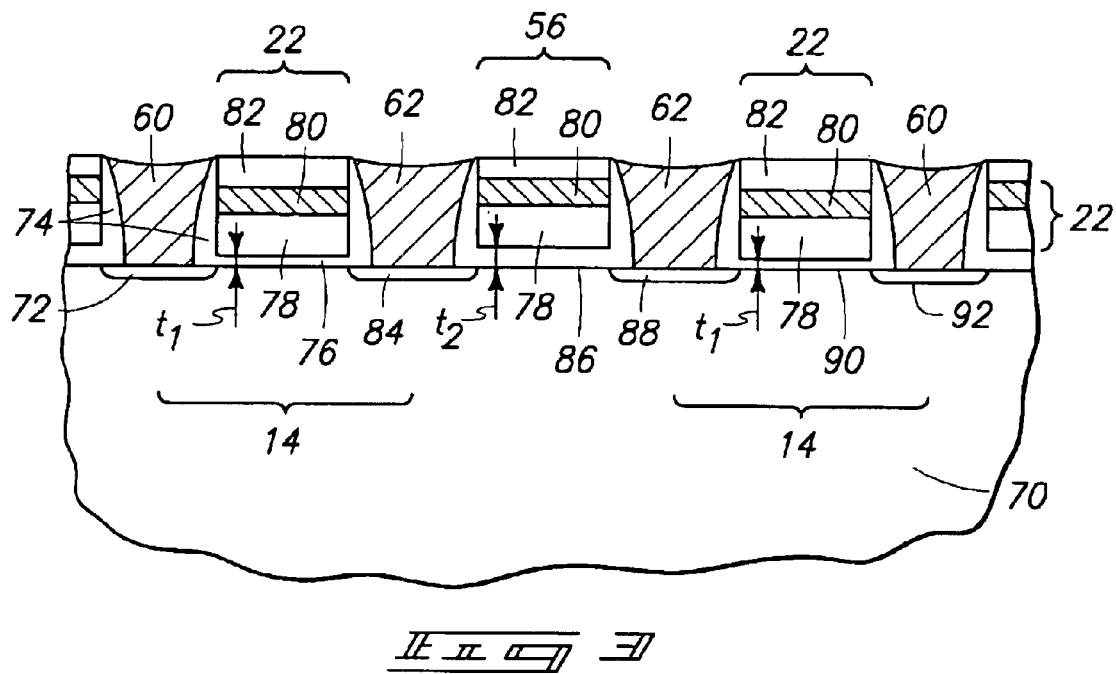
FIG. 3 is a simplified cross-sectional view, taken along lines 3—3 of FIG. 2, of several memory cells of the memory array of FIG. 2, in accordance with an embodiment of the present invention.

FIG. 3 is a simplified cross-sectional view, taken along lines 3—3 of FIG. 2, of several memory cells of the memory array 50 of FIG. 2, in accordance with an embodiment of the present invention. Structures shown in FIG. 3 are formed on top of a semiconductive substrate 70 (such as monocrystalline silicon). In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

At the far left of FIG. 3, a first diffusion region 72 is shown that is coupled to one of the bitline contacts 60. In one embodiment, the bitline contact 60 is formed from conventional polysilicon and is insulated from laterally adjacent structures by a conventional dielectric 74.

A first one of the wordlines 22 is shown adjacent to the first diffusion region 72, and is separated from the substrate 70 by a first gate dielectric 76 having a first thickness $t_1$. In one embodiment, the wordline 22 is formed from conventional polysilicon 78 and metal silicide 80 and is insulated from structures formed atop the wordline by a conventional dielectric capping layer 82.

A second diffusion region 84 is shown adjacent the first one of the wordlines 22, and is coupled to one of the storage node contacts 62. In one embodiment, the storage node contact 62 is formed from conventional polysilicon and is insulated from laterally adjacent structures by conventional dielectric sidewalls 74.

The first 72 and second 84 diffusion regions and the first one of the wordlines 22 together with the first gate dielectric 76 a wordline 22 form one of the access devices 14 of FIG. 1.

One of the isolation gates 56 is shown adjacent the second diffusion region 84 and is separated from the substrate 70 by a second gate dielectric 86 having a second thickness $t_2$ that is greater than the first thickness $t_1$. A third diffusion region 88 is shown adjacent the isolation gate 56, and is coupled to another one of the storage node contacts 62. The second diffusion region 84, third diffusion region 88 and isolation gate 56 collectively form an isolation transistor, with the diffusion regions 84 and 88 corresponding to load electrodes of an isolation transistor.

A second one of the wordlines 22 of FIG. 2 is shown adjacent the third diffusion region 88 and is separated from the substrate by a third gate dielectric 90 having the first thickness $t_1$. A fourth diffusion region 92 is shown adjacent the second one of the wordlines 22 and is coupled to another one of the bitline contacts 60 of FIG. 2. The third 88 and fourth 92 diffusion regions and the second wordline 22 together with the third gate dielectric 90 form another of the access devices 14 of FIG. 1.

The isolation gate 56 is tied to a low voltage, such as $V_{SS}$ (ground) or a more negative voltage, e.g., $V_{BB}$ (a voltage corresponding to the bulk of the semiconductor wafer or to a p-well voltage) during normal operation. As a result, the portion of the active area 54 (FIG. 2) between adjacent storage node contacts 62 corresponds to a transistor that is normally turned OFF, providing electrical isolation between the two adjacent storage node contacts 62.

When a datum is stored in one of the memory cells 12 of FIG. 1, for example, by charging the associated capacitor 16 to a power supply voltage such as $V_{CC}$ or ground, electrical fields induced in the second gate dielectric 86, and especially at edges of the second gate dielectric 86 by the diffusion regions 84 and 88, tend to result in gate-induced leakage currents that reduce the amount of charge that is stored in the neighboring memory cells 12 over time. The gate-induced leakage current is largest when the storage node contact 62 is set to $V_{CC}$ in order to charge and maintain the capacitor voltage at $V_{CC}$ because the voltage difference between the storage node contact 62 and the isolation gate 56 is then maximized.

Selecting the thickness $t_2$ of the second gate dielectric 86 to be greater than the thickness $t_1$ of the first 76 and third 90 gate dielectrics also increases a threshold voltage $V_t$ associated with the isolation gate 56. As a result, gate-induced leakage current associated with the isolation gate 56 is reduced, providing increased storage times, allowing increased storage time between refresh cycles, reducing power dissipation and improving DRAM performance.

In one embodiment, thickness $t_1$ is about 50 Angstroms, and thickness $t_2$ may be chosen to be in a range of from about 70 Angstroms to about 100 Angstroms. In one embodiment, thickness $t_2$ is chosen to be between 30% and 70% thicker than thickness $t_1$. In one embodiment, the thickness $t_1$ is chosen to form a pseudo isolation oxide, i.e., to be thicker than other gate dielectrics used in the memory arrays 10, 10' (FIG. 1) but thinner than the dielectric employed in the STI regions 52 (FIG. 2).

Figure 4:
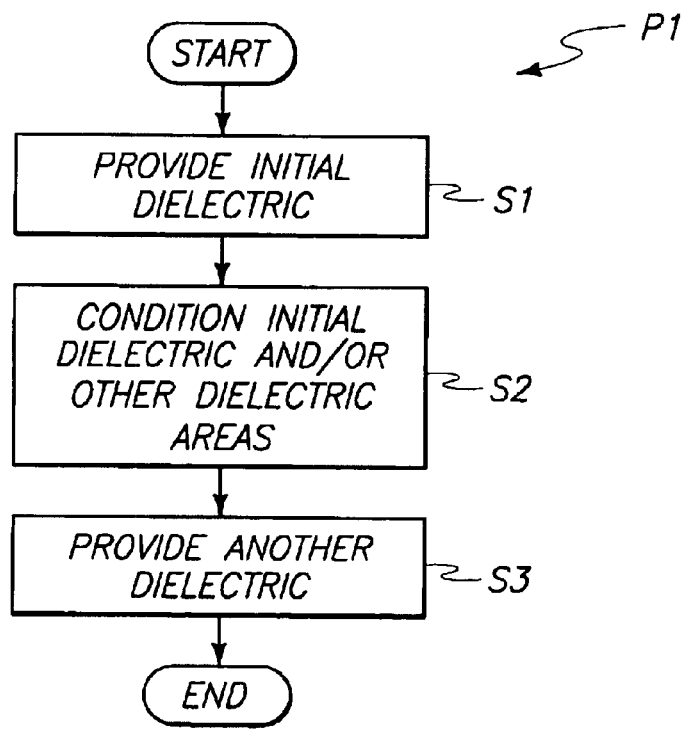
FIG. 4 is a simplified flowchart summarizing processes for realizing structures such as that shown in FIG. 3, which may be formed in several different ways, in accordance with embodiments of the present invention.

FIG. 4 is a simplified flowchart summarizing processes P1 for realizing structures such as that shown in FIG. 3, which may be formed in several different ways.

In a first approach, an initial gate dielectric is grown in a step S1 in first regions, such as the isolation gate 56 regions and suitable peripheral circuitry areas, to an initial thickness. The initial gate dielectric may also be grown in the access device 14 gate regions.

In a step S2, at least portions of the initial dielectric are conditioned. In one embodiment, the first regions where a thicker gate dielectric is desired are masked, and initial dielectric material is stripped, for example by conventional wet etching, from regions where the thicker gate dielectric is not desired, such as the access device 14 gate regions.

In a step S3, a second gate dielectric growth process is carried out to form the first gate dielectrics 76, 90 for the access devices 14. The step S3 may increase the thickness of the initial dielectric in the first regions to provide the thicker second dielectric 86 of FIG. 3. In one embodiment, the gate dielectrics 76, 86 and 90 comprise silicon dioxide grown via conventional oxidation processes. The process P1 then ends, and other processing is carried out to form the completed DRAM.

In a second approach, in the step S1, trenches are formed that will later correspond to the isolation gates 56. In one embodiment, these trenches may have a depth equal to that of conventional STI trenches employed for the rest of the memory array. In one embodiment, these trenches may have a depth less than that of conventional STI trenches employed for the rest of the memory array. In one embodiment, a threshold adjustment implant may be then carried out, for example, by implanting boron into the trenches. These trenches are then filled with a thick gate dielectric. In one embodiment, the thick gate dielectric may be silicon dioxide formed using a conventional TEOS process.

In the step S2, the thick gate dielectric is then conditioned by planarization (step S2), for example, using conventional chemical-mechanical mechanical polishing to provide the second dielectric 86 of FIG. 3. The conditioning also removes the thick gate dielectric from areas where it is not desired, for example, areas where other dielectrics may later be prepared.

Another dielectric is later grown (step S3), which forms first gate dielectrics 76 and 90 of FIG. 3. In one embodiment, the first gate dielectrics 76 and 90 are formed by conventional oxidation of silicon to provide silicon dioxide gate dielectrics having a thickness of about 50 Angstroms. The process P1 then ends, and other processing is carried out to form the completed DRAM.

A third approach may be used in processes that employ a sacrificial oxide during implants used to form the access devices 14. The sacrificial oxide is the initial dielectric formed during the step S1.

Following a threshold voltage adjustment implant, the sacrificial oxide is conditioned by partial etching to a thickness of about forty to fifty Angstroms in the step S2. Regions corresponding to the isolation gates 56 are then masked, and the remainder of the sacrificial oxide is then etched from areas other than those corresponding to the isolation gates 56 in the step S2.

The masking material is then removed, and gate dielectric material is grown for forming gates dielectrics 76 and 90 of FIG. 3 for the access devices 14 using conventional processes in the step S3. The step S3 may also increase thickness of the initial dielectric to form the second gate dielectric 86 of FIG. 3 during the step S3. The process P1 then ends, and other processing is carried out to form the completed DRAM.

Field effect transistors 14 (FIG. 1) are characterized by a source region, a drain region and a gate. The source and drain regions are typically received within a semiconductive material, such as a semiconductive substrate. The gate is typically disposed elevationally over the source and drain regions. A gate voltage of sufficient minimum magnitude can be placed on the gate to induce a channel region underneath the gate and between the source and drain regions. Such channel-inducing voltage is typically referred to as the transistor's threshold voltage, or $V_t$. Accordingly, application of the threshold voltage $V_t$ to the transistor gate turns the transistor ON. Once the magnitude of the threshold voltage $V_t$ has been exceeded, current can flow between the source and drain regions in accordance with a voltage called the source/drain voltage, or $V_{ds}$.

Threshold voltage magnitudes can be affected by channel implants. Specifically, during fabrication of semiconductor devices, a substrate can be implanted with certain types of impurity to modify or change the threshold voltage $V_t$ of a resultant device. Such channel implants can also affect a condition known as subsurface punchthrough. Punchthrough is a phenomenon which is associated with a merging of the source and drain depletion regions within a MOSFET. Specifically, as the channel gets shorter (as device dimensions get smaller), depletion region edges get closer together. When the channel length is decreased to roughly the sum of the two junction depletion widths, punchthrough is established. Punchthrough is an undesired effect in MOSFETs.

One way of addressing punchthrough in sub-micron devices is through provision of a so-called halo implant, also known as a "pocket" implant. Halo implants are formed by implanting dopants (opposite in type to that of the source and drain) within the substrate proximate the source and/or drain regions, and are typically disposed underneath the channel region. The implanted halo dopant raises the doping concentration only on the inside walls of the source/drain junctions, so that the channel length can be decreased without needing to use a more heavily doped channel. That is, punchthrough does not set in until a shorter channel length because of the halo implant.

Figure 5:
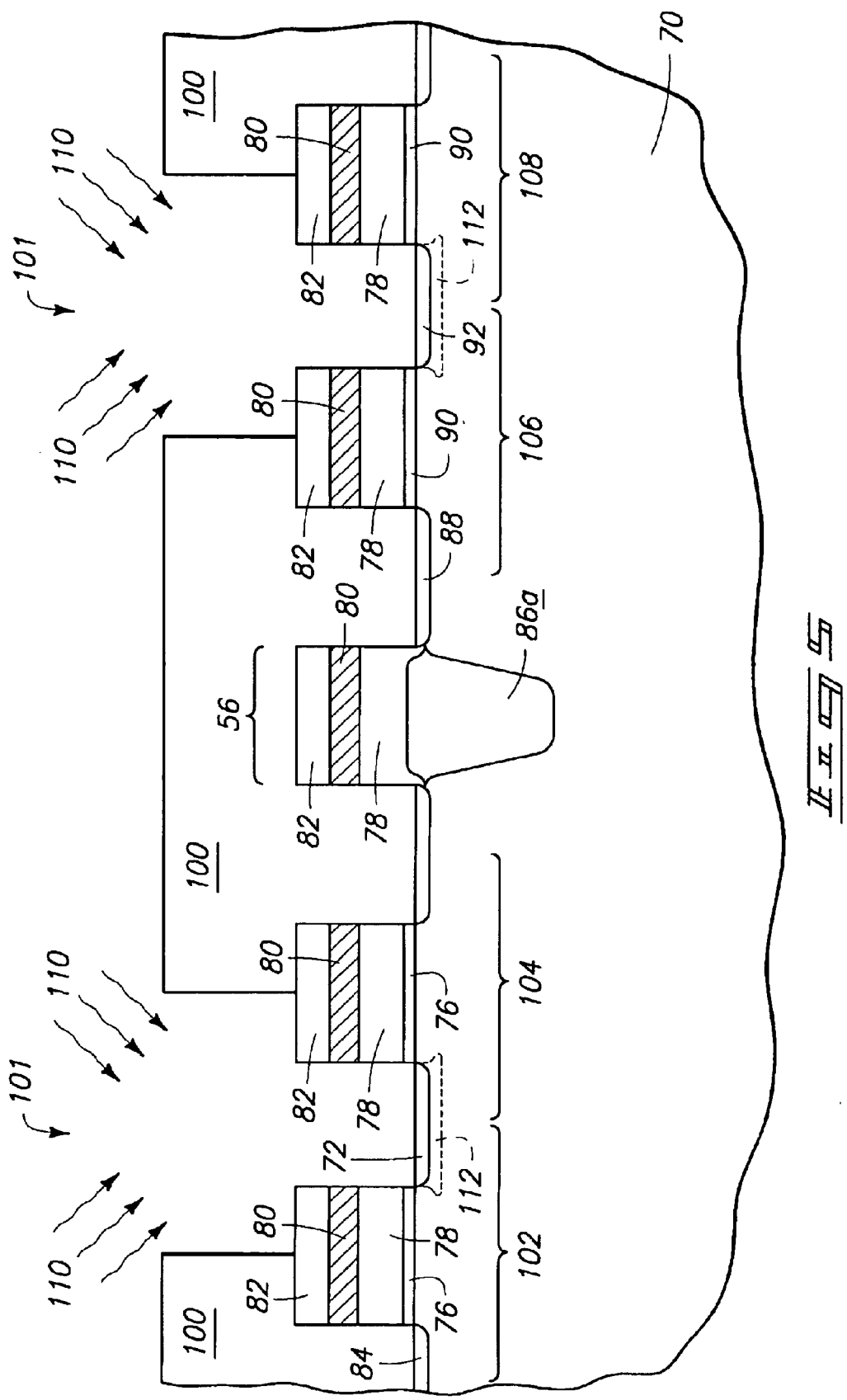
FIG. 5 is a simplified cross-sectional view including some of the structures of FIG. 3 at an earlier stage in processing, in accordance with an embodiment of the present invention.

FIG. 5 is a simplified cross-sectional view including some of the structures of FIG. 3 at an earlier stage in processing, in accordance with an embodiment of the present invention. A masking material 100 has been applied and patterned following formation and patterning of the gate dielectric layers 76, 86 and 90, the layers 78 and 80 forming the gates and the dielectric capping layer 82. Openings 101 in the masking material 100 correspond to locations where the bitline contacts 60 of FIG. 4 will later be formed.

Areas 102, 104, 106 and 108 will correspond to access devices 14 (FIG. 1) at a later stage in processing. Each of these access devices includes source/drain diffusion regions (load electrodes) 72, 84, 88 and 92, with diffusion regions 72 and 92 being shared by adjacent access transistors.

The openings 101 are formed above regions 72 and 92, upon which bitline contacts 60 will later be formed. By implanting only the bitline contact side regions of the access devices with a halo implant 110, halo regions 112 are formed on only those diffusion regions corresponding to access device load electrodes that are later coupled directly to bitline contacts 60 (FIGS. 3, 4). This allows the channel doping to be reduced while maintaining the same threshold voltage and subthreshold voltage for the access devices. The lower channel doping, in turn, gives rise to improved DRAM refresh characteristics, because charge leakage from the storage nodes 62 (corresponding to diffusion regions 84 and 88) is reduced. In one embodiment, the halo implant 110 comprises boron.

Implants and angled implants, as well as implants into the bit contact side of DRAM access transistors, are discussed in co-pending application Ser. No. 09/388,856, filed on Sep. 1, 1999, listing Luan C. Tran as the inventor, which application is assigned to the assignee of the instant application, the teachings of which are hereby incorporated herein by reference.

It will be appreciated that when boron is implanted into a n-type device, n-well bias plugs and other conventional features should be masked to avoid compromise of the conductivity of these features.

When the halo implant 110 is performed prior to formation of sidewalls 74 (FIG. 3), it is normally accompanied by an n-minus implant resulting in diffusion regions 72 and 92. When the halo implant 110 is performed after formation of the sidewalls 74, it is assumed that n-minus regions 72 and 92 were previously formed as part of a lightly-doped drain structure.

FIG. 6 is a simplified cross-sectional view including some of the structures of FIG. 3 at an earlier stage in processing, in accordance with an embodiment of the present invention. The embodiment of FIG. 6 differs from the embodiment of FIG. 5 in that shallow trench techniques have been employed to provide a thickened gate dielectric 86a that extends below the surface of the substrate 70. In one embodiment, the thickened gate dielectric 86a is formed to have a thickness of about one-half of the thickness of conventional shallow trench isolation dielectric material. In one embodiment, the thickened gate dielectric 86a is formed to have a thickness similar to that of conventional shallow trench isolation dielectric material.

By combining the isolation gate 56 having an increased threshold voltage $V_t$ together with access devices 14 (FIG. 1) having bitline contact side only halo implants, the threshold voltages for the isolation gates 56 and the access devices 14 can be independently adjusted. As a result, the inter-cell isolation characteristics of the DRAM are improved, without compromise of access device 14 charge leakage characteristics.

A further benefit to the structures described herein is that the double row redundancy scheme that had been previously employed in many $6F^2$ DRAM architectures can be eliminated in favor of single row redundancy. This is because the isolation characteristics of the modified isolation gates 56 allows a single row of memory cells 12 of FIG. 1 (corresponding to one of the wordlines 22 of FIG. 2) that includes one or more defects to be replaced with a single row of redundant memory cells without unacceptable performance degradation of another row of memory cells abutting the isolation gate 56 that separates that row of memory cells from the row of memory cells that includes the defect(s).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming memory cells in an array including:
    forming a first memory cell including a first access transistor and a first data storage capacitor, a first load electrode of the first access transistor being coupled to the first data storage element via a first storage node formed on a substrate;
    forming a second memory cell including a second access transistor and a second data storage element, a first load electrode of the second access transistor being coupled to the second data storage capacitor via a second storage node formed on the substrate, wherein forming the first and second memory cells includes forming the first and second access transistors to have a first threshold voltage; and
    forming an isolation gate between the first and second storage nodes and configured to provide electrical isolation therebetween, wherein forming the isolation gate includes forming the isolation gate to have a second threshold voltage greater than the first threshold voltage.

2. The method of claim 1, wherein forming first and second access transistors includes forming first gate dielectrics with a first thickness for each of the first and second access transistors and further comprising forming an isolation gate dielectric to have a second thickness that is between thirty percent and seventy percent thicker than the first thickness.

3. The method of claim 1, wherein forming first and second access transistors includes forming first gate dielectrics with a first thickness of about fifty Angstroms for each of the first and second access transistors and further comprising forming an isolation gate dielectric to have a second thickness in a range of from about seventy Angstroms to about one hundred Angstroms.

4. The method of claim 1, wherein forming memory cells comprises forming DRAM memory cells and wherein forming first and second memory cells includes forming first and second memory cells wherein the first and second data storage elements comprise capacitors.

5. The method of claim 1, wherein forming the first and second memory cells includes forming DRAM memory cells, and further comprising:
    forming each of the access transistors to include a second load electrode coupled to a respective bitline contact; and
    implanting a halo implant in each of the access transistors only on a bitline contact side thereof to provide the threshold voltage determined in part by the halo implant.

6. The method of claim 1, wherein the first and second data storage elements comprise capacitors.

7. The method of claim 1, wherein forming first and second access transistors includes forming first gate dielectrics with a first thickness for each of the first and second access transistors, and wherein forming the isolation gate includes forming a second gate dielectric comprising an isolation gate dielectric to have a second thickness that is greater than the first thickness.

8. The method of claim 1, wherein forming first and second access transistors includes forming first gate dielectrics with a first thickness for each of the first and second access transistors and further comprising an isolation gate dielectric by:
    forming a shallow trench;
    forming an isolation gate dielectric by a deposition process that fills the shallow trench with a dielectric material; and
    planarizing the dielectric material using chemical-mechanical polishing, wherein the isolation gate dielectric is formed to have a second thickness that is greater than the first thickness.

9. The method of claim 7, wherein forming the first and second memory cells includes forming the first and second gate dielectrics to be silicon dioxide.

10. The method of claim 8, further comprising implanting dopant into the shallow trench prior to forming the isolation gate dielectric.

* * * * *

UNITED STATES PATENT AND TRADEMARK OFFICE
CERTIFICATE OF CORRECTION

PATENT NO. : 6,825,077 B2
DATED : November 30, 2004
INVENTOR(S) : Tran

It is certified that error appears in the above-identified patent and that said Letters Patent is hereby corrected as shown below:

Column 7,
Line 24, please delete "mechanical" after "chemical-mechanical".

Column 9,
Lines 58 and 65, please delete "capacitor" after "storage" and insert -- element --.

Column 10,
Line 35, please insert -- first -- before "threshold".
Line 50, please insert -- forming -- after "comprising".

Signed and Sealed this

Fourth Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,825,077 B2
DATED : November 30, 2004
INVENTOR(S) : Tran

It is certified that error appears in the above-identified patent and that said Letters Patent is hereby corrected as shown below:

Column 7,
Line 24, please delete "mechanical" after "chemical-mechanical".

Column 9,
Lines 58 and 65, please delete "capacitor" after "storage" and insert -- element --.

Column 10,
Line 35, please insert -- first -- before "threshold".
Line 50, please insert -- forming -- after "comprising".

Signed and Sealed this

Eighteenth Day of October, 2005

JON W. DUDAS
*Director of the United States Patent and Trademark Office*